(12) United States Patent
Hamada et al.

(10) Patent No.: US 6,300,647 B1
(45) Date of Patent: Oct. 9, 2001

(54) CHARACTERISTIC-EVALUATING STORAGE CAPACITORS

(75) Inventors: Takehiko Hamada; Naoki Kasai, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/467,969

(22) Filed: Dec. 21, 1999

(30) Foreign Application Priority Data

Dec. 21, 1998 (JP) .................................................. 10-362910

(51) Int. Cl.⁷ .............................. H01L 23/58; H01L 21/66
(52) U.S. Cl. .................................. 257/48; 257/68; 438/14
(58) Field of Search .................................. 257/48, 68, 71, 257/532; 438/11, 14, 15, 17, 18, 311

(56) References Cited

U.S. PATENT DOCUMENTS

| | | | |
|---|---|---|---|
| 5,783,462 | * 7/1998 | Huang | 438/17 |
| 5,801,412 | 9/1998 | Tobita | 257/206 |
| 5,977,558 | * 11/1999 | Lee | 257/48 |
| 6,157,045 | * 12/2000 | Shimomura | 257/48 |

FOREIGN PATENT DOCUMENTS

| | | |
|---|---|---|
| 63-124542 | 5/1988 | (JP) . |
| 5-102264 | 4/1993 | (JP) . |
| 6-260614 | 9/1994 | (JP) . |
| 9-74144 | 3/1997 | (JP) . |

* cited by examiner

Primary Examiner—Olik Chaudhuri
Assistant Examiner—Hoai Pham
(74) Attorney, Agent, or Firm—Foley & Lardner (57) ABSTRACT

A device for capacitor characteristic evaluation is provided, which enables measurement of the characteristic of a capacitor immediately after the completion of its formation processes, and which improves the fabrication yield. This device is comprised of (a) a conductive region formed on a semiconductor substrate; (b) an interlayer dielectric layer formed to cover the conductive layer; (c) a first electrode formed on the interlayer dielectric layer; (d) a second electrode formed on the interlayer dielectric layer to be apart from the first electrode; the second electrode being electrically connected to the first electrode through the conductive region; (e) a capacitor dielectric formed to cover the first and second electrodes; the capacitor dielectric being contacted with the first and second electrodes; (f) a third electrode formed on the capacitor dielectric to be opposite to the first electrode via the capacitor dielectric; (g) a fourth electrode formed on the capacitor dielectric to be apart from the third electrode to be opposite to the second electrode via the capacitor dielectric; (h) the first electrode, capacitor dielectric, and third electrode constitute a first capacitor and the second electrode, capacitor dielectric, and fourth electrode constitute a second capacitor; and (i) the third and fourth electrodes constitute a pair of measuring terminals.

17 Claims, 9 Drawing Sheets

CHARACTERISTIC-EVALUATING STORAGE CAPACITORS

BACKGROUND OF THE INVENTION

1. Field of the Invention

The present invention relates to a semiconductor device for characteristic evaluation and a method of a more particularly, to a semiconductor device used for evaluating the electrical characteristic of a capacitor or capacitors, and a method of evaluating the same using the device. The capacitor or capacitors have the same configuration as that of an objective capacitor or capacitors to be evaluated, such as storage capacitors incorporated into memory cells of semiconductor memory devices or other devices.

2. Description of the Prior Art

In recent years, the miniaturization and integration of semiconductor memory devices has been increasingly progressing and accordingly, there has been the increasing need to decrease the memory cell area per bit. In particular, with dynamic random-access memories (DRAMs), even if the memory cell area per bit is decreased, the storage capacitor of the memory cell must have a specific desired capacitance. To meet this need, various improved methods for forming the storage capacitor have ever been developed and disclosed. For example, the use of a high-dielectric-constant firm for the capacitor dielectric and the use of the hemispherical grain (HSG) silicon for capacitor electrodes have been disclosed.

On the other hand, in the semiconductor device fabrication field, the processes have been becoming advanced and complicated according to the miniaturization trend of DRAMs. Thus, the techniques aiming at the inspection and monitoring of the device quality during the fabrication process sequence have been becoming more important.

A typical example is the visual inspection of semiconductor wafers. If some contamination is generated in a process step of the fabrication process sequence, the semiconductor devices become faulty or defective at this process step. Therefore, the devices will be useless even if the wafers are subjected to the subsequent processes as desired, which results in decrease in their fabrication yield and increase in their fabrication cost. Consequently, it is important to find or detect the contamination in as early stages as possible.

With respect to the storage capacitors of DRAMs, similarly, it has been becoming important to measure the electrical characteristic of the storage capacitors for inspection during their fabrication process sequence. The most reliable method of measuring the capacitor characteristic such as the capacitance and the leakage current is to actually apply a specific voltage to the capacitor to be inspected and to measure its electrical characteristic in the operating state. However, this is very difficult to be performed, because the storage capacitors are incorporated into the memory cell. To solve this problem, conventionally, the following method has been used.

Specifically, "evaluating capacitors", which are equivalent in configuration to the storage capacitors of the memory cell, are additionally formed on the same wafer as that of the DRAMs. Then, the electrical characteristic of the evaluating capacitors is measured, instead of the storage capacitors in the DRAM, memory cells. An example of the prior-art evaluating capacitors is shown in FIG. 1.

Figure 1:
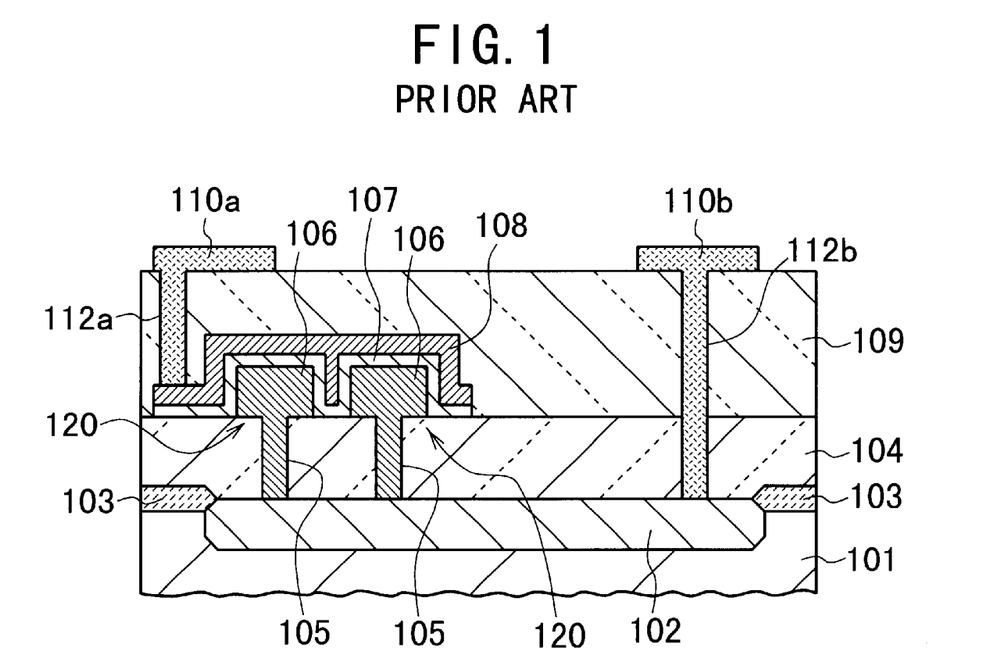
FIG. 1 is a schematic, partial cross-sectional view of a prior-art evaluating semiconductor device equipped with evaluating capacitors.

FIG. 1 shows the configuration of a prior-art evaluating semiconductor device equipped with evaluating capacitors.

As seen from FIG. 1, the prior-art evaluating semiconductor device is equipped with a p-type single-crystal silicon (Si) substrate 101, on which evaluating capacitors 120 are formed. An n-type diffusion region 102 is formed on the surface area of the substrate 101. The diffusion region 102 is electrically isolated from other elements (not shown) by an isolation dielectric 103.

A first interlayer dielectric layer 104 is formed on the substrate 101 to cover the diffusion region 102 and the isolation dielectric 103. The layer 104 has contact holes 105 vertically penetrating through the same, exposing the surface of the diffusion region 102. On the layer 104, lower electrodes 106, which are made of n-type polysilicon, are formed to be electrically connected to the underlying diffusion region 102 through the contact holes 105.

A common capacitor dielectric 107, which is made of silicon nitride ($SiN_x$), is formed on the first interlayer dielectric layer 104 to cover the lower electrodes 106. On the dielectric 107, a common upper electrode 103 made of n-type polysilicon is formed to entirely overlap with the dielectric 107. The upper electrode 108 is located to be opposed to the lower electrodes 106. The lower electrodes 106, the common upper electrode 108, and the common capacitor dielectric 107 constitute the evaluating capacitors 120.

A second interlayer dielectric layer 109, which is made of silicon dioxide ($SiO_2$), is formed on the first interlayer dielectric layer 104 to cover entirely the upper electrode 108 and the capacitor dielectric 107 on the layer 109, upper wiring lines 110a and 110b are formed to be apart from each other. The wiring line 110a is electrically connected to the underlying upper electrode 108 by way of a contact hole 112a penetrating through the layer 109. The wiring line 110b is electrically connected to the underlying diffusion region 102 of the substrate 101 by way of a contact hole 112b penetrating through the layers 109 and 104.

With the prior-art evaluating semiconductor device shown in FIG. 1, the lower electrodes 106 are electrically connected to the wiring line 110b through the diffusion region 102, and the common upper electrode 108 is electrically connected to the wiring line 110a. Therefore, to measure the characteristic of the evaluating capacitors 120, a suitable measuring apparatus such as a capacitance meter is electrically connected to the electrodes 106 and 108 by way of the wiring lines 110a and 110b. The characteristic thus measured corresponds to that of the storage capacitors (not shown) in the DRAM memory calls formed on the same substrate 101 and therefore, the characteristic of the storage capacitors can be found.

However, the prior-art evaluating semiconductor device of FIG. 1 has the following problems.

As seen from FIG. 1, a measuring apparatus is electrically connected to the upper wiring lines 110a and 110b, because it is unable to be directly connected to the lower electrodes 106 and the upper electrode 108. Therefore, there is a problem that the characteristic measurement of the evaluating capacitors 120 needs to be performed after the completion of the formation steps of the wiring lines 110a and 110b on the second interlayer dielectric layer 109. In other words, a problem that the characteristic of the capacitors 120 cannot be measured immediately after the completion of their formation steps will occur.

Moreover, if some fault or defect occurs in the characteristic of the capacitors 120 (i.e., the storage capacitors of the DRAM calls on the substrate 101), the fault or defect will not be found until the characteristic measurement of the capacitors 120 is completed. In other words, time delay or lag cannot be avoided in coping with the generation of the fault or defect. As a result, the faulty DRAM cells are subjected to subsequent fabrication processes during the time lag. This means that there arises another problem that the fabrication yield decreases and the fabrication cost increases.

The Japanese Non-Examined Patent Publication No. 5-102264 published in April 1993 discloses a method of measuring the capacitance of DRAM cells.

In this prior-art method of 5-102264, an evaluating capacitor having the same configuration as that of a DRAM cell capacitor is formed within a testing chip. The evaluating capacitor is formed by a storage node (i.e. a lower electrode), a cell plate (i.e., an upper electrode), and a capacitor dielectric intervening between the storage node and the cell plate. The storage node is electrically connected to a device formation region (i.e., an active region). Two electrodes are formed to be electrically connected to the cell plate and the device formation region by way of contact holes of an interlayer dielectric layer, respectively. To measure the capacitance of the evaluating capacitor, a specific voltage is applied across the two electrodes.

With the prior-art method of 5-102264, the two electrodes used for capacitance measurement are formed after the evaluating capacitor is formed. Thus, there is a problem that the characteristic of the evaluating capacitor cannot be measured immediately after the completion of its formation processes. Also, because of the same reason as explained in the prior-art device of FIG. 1, there is a problem that the fabrication yield is decreased and the fabrication cost is increased.

The Japanese Non-Examined Patent Publication No. 6-260614 published in September 1994 discloses a device and a method of evaluating the capacitance of DRAM cells.

In this prior-art method of 6-260614, the device comprises a memory call having a transmission transistor and a memory cell capacitor, and an additional Metal-Oxide-Semiconductor Field-Effect Transistor (MOSFET) for evaluation. The gate electrode of the additional MOSFET is electrically connected to the cell plate electrode of the memory cell capacitor. A specific variable voltage is applied to the storage electrode of the memory cell capacitor. The voltage change of the cell plate electrode according to the applied variable voltage is found from the voltage-current characteristic of the additional MOSFET or the current change thereof, thereby measuring the capacitance or leakage current of the memory cell capacitor.

With the prior-art method and device of 6-260614, a variable voltage is applied to the gate electrode of the MOSFET and then, the voltage change of the call plate electrode of the memory cell capacitor is measured. Also, although not disclosed in the Publication, wiring lines need to be provided for applying the voltage to the gate electrode of the additional MOSEET and for measuring the voltage of the cell plate voltage. These wiring lines are formed after the completion of the formation of the memory cell capacitor. As a result, there is a problem that the characteristic of the memory cell capacitor cannot be measured immediately after the completion of its formation processes. Moreover, because of the same reason as explained in the prior-art device of FIG. 1, there is a problem that the fabrication yield is decreased and the fabrication cost is increased.

SUMMARY OF THE INVENTION

Accordingly, an object of the present invention is to provide a semiconductor device for evaluating the capacitor characteristic and a method of evaluating the same that make it possible to measure the characteristic of a capacitor immediately after the completion of its formation processes.

Another object of the present invention is to provide a semiconductor device for evaluating the capacitor characteristic and a method of evaluating the same that increase the fabrication yield and decrease the fabrication cost.

The above objects together with others not specifically mentioned will become clear to those skilled in the art from the following description.

According to a first aspect of the present invention, a semiconductor device for evaluating the capacitor characteristic is provided, which is comprised of:

(a) a semiconductor substrate;

(b) an interlayer dielectric layer formed on or over the substrate;

(c) a first electrode formed on the interlayer dielectric layer;

(d) a second electrode formed on the interlayer dielectric layer to be apart from the first electrode;
  the second electrode being electrically connected to the first electrode through an interconnection line;

(e) a first capacitor dielectric formed to cover the first electrode;
  the first capacitor dielectric being contacted with the first electrode;

(f) a second capacitor dielectric formed to cover the second electrode;
  the second capacitor dielectric being contacted with the second electrode;

(g) a third electrode formed on the first capacitor dielectric to be opposite to the first electrode through the first capacitor dielectric;

(h) a fourth electrode formed on the second capacitor dielectric to be apart from the third electrode;
  the fourth electrode being be opposite to the second electrode through the second capacitor dielectric;

(i) the first and third electrodes and the first capacitor dielectric constitute a first evaluating capacitor aid the second and fourth electrodes and the second capacitor dielectric constitute a second evaluating capacitor; and (j) the third and fourth electrodes constitute a pair of measuring terminals.

With the semiconductor device according to the first aspect of the present invention, the first evaluating capacitor formed by the first and third electrodes and the first capacitor dielectric and the second evaluating capacitor formed by the second and fourth electrodes and the second capacitor dielectric are electrically connected in series to each other by way of the interconnection line. Also, the third and fourth electrodes formed on (i.e., exposed from) the interlayer dielectric layer constitute the pair of measuring electrodes.

Therefore, if a suitable measuring apparatus is connected across the third and fourth electrodes serving as the pair of measuring electrodes, the total characteristic of the first and second, serially-connected evaluating capacitors is measured. Since the configuration of the first and second capacitors are, knower the characteristic of the first or second capacitor can be given from the measurement result thus obtained by, for example, multiplying a specific constant corresponding to the capacitance values of the first and second capacitors with the measurement result.

Since the third and fourth electrodes themselves constitute the pair of measuring electrodes, no upper wiring lines nor other electrodes are necessary for measuring. Thus, the characteristic of the first or second capacitor can be measured immediately after the completion of its formation processes. This increases the fabrication yield and decreases the fabrication coat of a semiconductor device including capacitors corresponding to the first or second evaluating capacitor In a preferred embodiment of the device according to the first aspect of the invention, the first and second capacitors are equal in capacitance. In this embodiment, there is an additional advantage that the fabrication of the semiconductor device and the calculation of the characteristic of the first or second capacitor are facilitated.

In another preferred embodiment of the device according to the first aspect of the invention, the second capacitor dielectric has a dielectric breakdown voltage. When an external voltage greater than the dielectric breakdown voltage is applied across the second and fourth electrodes, the second and fourth electrodes are electrically connected to each other due to dielectric breakdown of the second capacitor dielectric. In this embodiment, there is an additional advantage that the capacitance of the first capacitor can be measured directly, because the second capacitor is short-circuited by the external voltage and at the same time, the measured characteristic corresponds to the characteristic of the first capacitor.

In this embodiment, it is preferred that the first capacitor is greater in capacitance than the second capacitor. This is because the external voltage can be easily applied across the second and fourth electrodes through the pair of measuring terminals. Specifically, the external voltage applied across the pair of measuring terminals is divided to be applied to the first and second capacitors, where the values of the divided voltages are proportional to the capacitance values of the first and second capacitors. As a result, the voltage applied across the secondhand fourth electrodes of the second capacitor is larger in value than that across the first and third electrodes of the first capacitor. This means that a desired external voltage greater than the dielectric breakdown voltage of the second capacitor dielectric can be selectively applied across the second and fourth electrodes easily while no dielectric breakdown occurs in the first capacitor dielectric.

Furthermore, in this embodiment, it is preferred that the first capacitor has a capacitance ten times as large as that of the second capacitor, or greater. Since the values of the divided voltages are proportional to the capacitance values of the first and second capacitors, there is an additional advantage that a desired external voltage greater than the dielectric breakdown voltage of the second capacitor dielectric can be applied across the second and fourth electrodes more easily while no dielectric breakdown occurs in the second capacitor dielectric.

The external voltage may be applied across the fourth electrode and the substrate if the substrate is electrically connected to the interconnection line.

In still another preferred embodiment of the device according to the first aspect of the invention, the second capacitor dielectric has a mechanical breakdown strength. When an external pressure greater than the mechanical breakdown strength is applied to the fourth electrode, the fourth electrode is deformed, thereby electrically connecting the fourth electrode to the second electrode. In this embodiment, the second and fourth electrodes are electrically connected to each other, resulting in short-circuit of the second capacitor. Therefore, the characteristic of the first capacitor can be measured by using the pair of measuring terminal. Thus, there is an additional advantage that the characteristic of the first capacitor can be directly measured.

According to a second aspect of the present invention, another semiconductor device for evaluating the capacitor characteristic is provided, which is comprised of:

(a) a semiconductor substrate;
(b) an interlayer dielectric layer formed on or over the substrate;
(c) a first electrode formed on the interlayer dielectric layer;
(d) a second electrode formed on the interlayer dielectric layer to be apart from the first electrode;
   the second electrode being electrically connected to the first electrode through an interconnection line;
(e) a capacitor dielectric formed to cover the first electrode;
   the capacitor dielectric being contacted with the first electrode;
(f) a third electrode formed on the capacitor dielectric to be opposite to the first electrode through the capacitor dielectric;
(g) the first and third electrodes and the capacitor dielectric constitute an evaluating capacitor; and
(h) the second and third electrodes constitute a pair of measuring terminals.

With the semiconductor device according to the second aspect of the present invention, the first and third electrodes and the capacitor dielectric constitute the evaluating capacitor, and the second and third electrodes constitute the pair of measuring electrodes. Also, the first and second electrodes are electrically connected to each other by way of the interconnection line. Therefore, the characteristic of the evaluating capacitor can be measured by using the pair of measuring terminals.

As a result, no upper wiring lines nor other electrodes are necessary for measuring the characteristic of the evaluating capacitor. This means that the characteristic of the evaluating capacitor can be measured immediately after the completion of its formation processes, which increases the fabrication yield and decreases the fabrication cost.

According to a third aspect of the present invention, a method of evaluating the capacitor characteristic is provided, which is comprised of the steps of:

(a) preparing the semiconductor devise according to the first aspect of the invention;
(b) electrically connecting a measuring apparatus across the pair of measuring terminals to generate a measurement result; and
(c) multiplying a specific constant with the measurement result, thereby finding a characteristic of the first or second capacitor.

With the method according to the third aspect of the present invention, the characteristic across the pair of measuring terminals is measured by the measuring apparatus to result in the measurement result using the semiconductor device according to the first aspect of the invention, and then, the specific constant is multiplied with the measurement result to find the characteristic of the first or second capacitor.

Thus, because of the same reason as that explained in the semiconductor device according to the first aspect of the invention, the characteristic of the first or second evaluating capacitor can be measured immediately after the completion of its formation processes and at the same time, the fabrication yield is increased and the fabrication cost is decreased.

In a preferred embodiment of the method according to the third aspect of the invention, the first and second evaluating capacitors are equal in capacitance. In this embodiment, there is an additional advantage that the fabrication of the semiconductor device and the calculation of the characteristic of the first or second capacitor are facilitated.

According to a fourth aspect of the present invention, another method of evaluating the capacitor characteristic is provided, which is comprised of the steps of:

(a) preparing a semiconductor device according to the first aspect of the invention;

(b) applying an external voltage across the fourth electrode and the substrate thereby electrically interconnecting the fourth electrode with the second electrode due to dielectric breakdown of the second capacitor dielectric; and (c) electrically connecting a measuring apparatus across the pair of measuring terminals to generate a measurement result, thereby finding a characteristic of the first evaluating capacitor from the measurement result.

With the method according to the fourth aspect of the present invention, the external voltage is applied across the substrate and the fourth electrode of the semiconductor device according to the first aspect of the invention and then, the fourth electrode is electrically connected to the second electrode due to the dielectric breakdown of the second capacitor dielectric. Thus, the characteristic of the first evaluating capacitor is directly measured from the measuring result obtained by using the pair of measuring terminals.

As a result, because of the same reason as that shown in the semiconductor device according to the first aspect of the invention, the characteristic of the first evaluating capacitor car be measured immediately after the completion of its formation, processes and at the same time, the fabrication yield is increased and the fabrication cost is decreased.

According to a fifth aspect of the present invention, still another method of evaluating the capacitor characteristic is provided, which is comprised of the steps of:

(a) preparing a semiconductor device according to the first aspect of the invention;

(b) applying an external voltage across the pair of measuring terminals, thereby electrically interconnecting the fourth electrode with the second electrode due to dielectric breakdown of the second capacitor dielectric; and (c) electrically connecting a measuring apparatus across the pair of measuring terminals to generate a measurement result, thereby finding a characteristic of the first evaluating capacitor from the measurement result.

With the method according to the fifth aspect of the present invention, since the external voltage is applied across the pair of measuring terminals (i.e., across the third and fourth electrodes), it is divided to be applied to the serially-connected, first and second evaluating capacitors. The values of the divided voltages are proportional to the capacitance values of the first and second capacitors. As a result, if suitably setting the capacitance values, the voltage applied across the second and fourth electrodes of the second capacitor can be made larger in value than that across the first and third electrodes of the first capacitor. Thus, the fourth electrode can be electrically interconnected with the second electrode due to dielectric. breakdown of the second capacitor dielectric while no dielectric breakdown occurs in the first capacitor dielectric. Accordingly, the characteristic of the first evaluating capacitor is directly given by the measurement result.

As a result, no upper wiring lines nor other electrodes are necessary for measuring the characteristic of the first evaluating capacitor. This means that the characteristic of the first evaluating capacitor can be measured immediately after the completion of its formation processes, which increases the fabrication yield and decreases the fabrication cost.

In a preferred embodiment of the method according to the fifth aspect of the invention, the first capacitor is greater in capacitance than the second capacitor. The external voltage applied across the pair of measuring terminals is divided to be applied to the first and second capacitors, where the values of the divided voltages are proportional to the capacitance values of the first and second capacitors. As a result, the voltage applied across the second and fourth electrodes of the second capacitor is larger in value than that across the first and third electrodes of the first capacitor. This means that a desired external voltage greater than the dielectric breakdown voltage of the second capacitor dielectric can be selectively applied across the second and fourth electrodes easily while no dielectric breakdown occurs in the first capacitor dielectric.

In this embodiment, it is preferred that the first capacitor has a capacitance ten times as large as that of the second capacitor, or greater. Since the values of the divided voltages are proportional to the capacitance values of the first and second capacitors, there is an additional advantage that a desired external voltage greater than the dielectric breakdown voltage of the second capacitor dielectric can be applied across the second and fourth electrodes more easily while no dielectric breakdown occurs in the second capacitor dielectric.

According to a sixth aspect of the present invention, a further method of evaluating the characteristic of a semiconductor device is provided, which is comprised of the steps of:

(a) preparing a semiconductor device according to the first aspect of the invention;

(b) applying an external pressure to the fourth electrode, thereby electrically interconnecting the fourth electrode with the second electrode due to deformation of the fourth electrode and mechanical breakdown of the second capacitor dielectric; and (c) electrically connecting a measuring apparatus across the pair of measuring terminals to generate a measurement result, thereby finding a characteristic of the first evaluating capacitor from the measurement result.

With the method according to the sixth aspect of the present invention, since the external pressure is applied to the fourth electrode, the fourth electrode is deformed. Because of this deformation, the second capacitor dielectric is mechanically broken to result in contact of the fourth electrode with the second electrode. Thus, the fourth electrode is electrically interconnected with the second electrode due to mechanical breakdown of the second capacitor dielectric while no mechanical breakdown occurs in the first capacitor dielectric. Accordingly, the characteristic of the first evaluating capacitor is directly given by the measurement result.

As a result, no upper wiring lines nor other electrodes are necessary for measuring the characteristic of the first evaluating capacitor. This means that the characteristic of the first evaluating capacitor can be measured immediately after the completion of its formation processes, which increases the fabrication yield and decreases the fabrication cost.

DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 2:
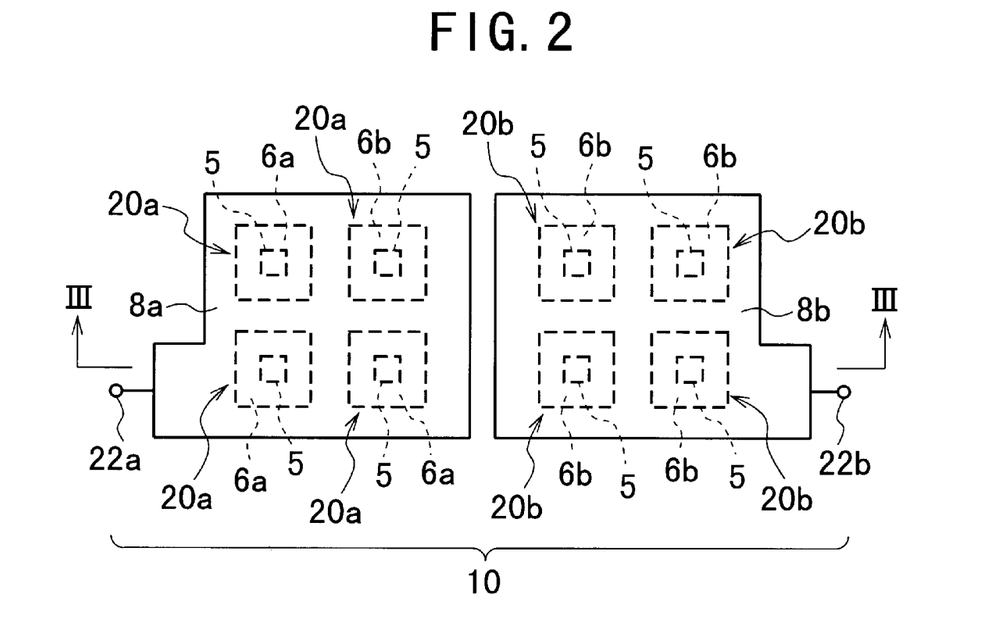
FIG. 2 is a schematic, partial plan view of an evaluating semiconductor device according to a first embodiment of the present invention, which has first four evaluating capacitors and second four evaluating capacitors.
Figure 3:
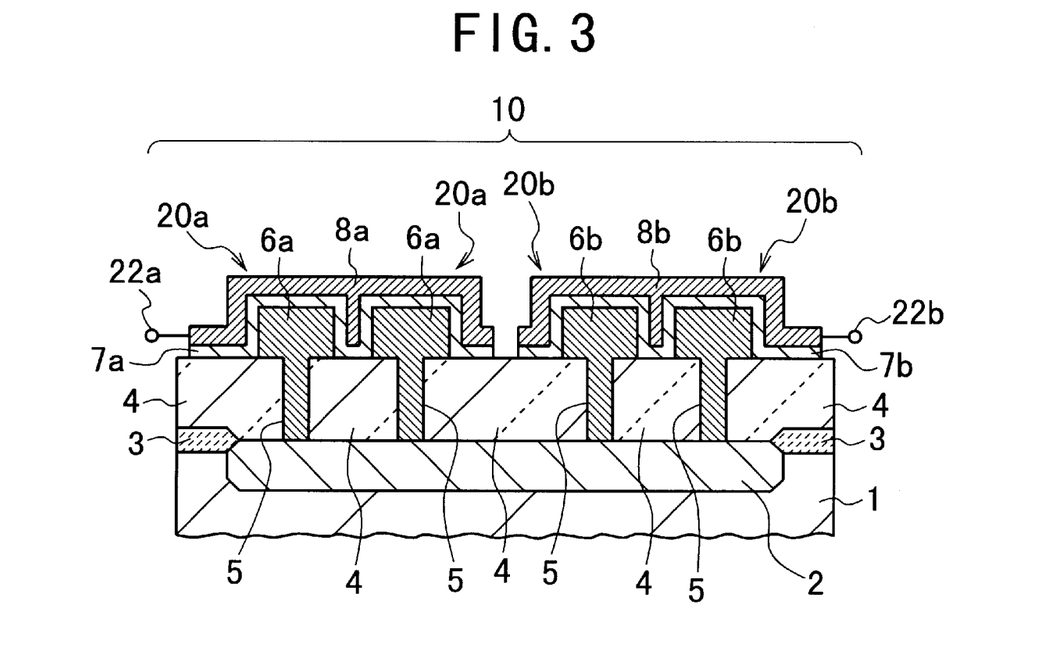
FIG. 3 is a schematic, partial, cross-sectional view along the line III—III in FIG. 2.

An evaluating semiconductor device according to a first embodiment of the present invention is shown in FIGS. 2 and 3, which is a device for evaluating the characteristic of evaluating capacitors formed on the device. The evaluating capacitors, which belong to the so-called Test Element Group (TEG), have the same configuration as that of the storage capacitors incorporated into the DRAM memory cells.

As seen from FIGS. 2 and 3, the evaluating semiconductor device 10 according to the first embodiment comprises a p-type single-crystal silicon substrate 1, on which four first capacitors 20a and four second capacitors 20b are formed.

An n-type diffusion region 2 is formed in the surface area of the substrate 1. The region 2 it isolated from other electronic elements (not shown) by an isolation dielectric layer 3. An interlayer dielectric layer 4 is formed on the whole surface of the substrate 1 to cover the diffusion region 2 and the isolation dielectric layer 3. The layer 4 has contact holes 5 vertically penetrating the same, from which the surface of the diffusion region 2 is exposed.

On the interlayer dielectric layer 4, four lower electrodes 6a for the first capacitors 20a and four lower electrodes 6b for the second capacitors 20b are formed to be apart to each other. The electrodes 6a and 6b have a layout as shown in FIG. 2. The electrodes 6a and 6b extend downward to be contacted with and electrically connected to the underlying diffusion region 2 through the contact holes 5 of the layer 4. The lower electrodes 6a, which are located apart from each other, have equal surface areas. The lower electrodes 6b, which are also apart from each other, have equal surface areas. Here, the surface area of each electrode 6a is set as equal to that of each electrode 6b. The electrodes 6a and 6b are made of low-resistance, n-type polysilicon.

A common capacitor dielectric 7a for the first capacitors 20a is formed on the interlayer dielectric layer 4 to cover entirely the four lower electrodes 6a. The dielectric 7a is contacted with the whole surface areas of the electrodes 6a. A common capacitor dielectric 7b for the second capacitors 20b is formed on the interlayer dielectric layer 4 to cover entirely the foyer lower electrodes 6b. The dielectric 7b is contacted with the whole surface areas of the electrodes 6b. The dielectrics 7a and 7b are made of $SiN_x$ having a high dielectric constant.

A common upper electrode 8a for the first capacitors 20a is formed on the capacitor dielectric 7a to be entirely overlapped therewith. Therefore, the electrode 8a has the same plan shape as that of the dielectric 7a. The electrode 8a is opposite to the four lower electrodes 6a. A common upper electrode 8b for the second capacitors 20b is formed on the capacitor dielectric 7b to be entirely overlapped therewith. Therefore, the electrode 8b has the same plan shape as that of the dielectric 7b. The electrode 8b is opposite to the four lower electrodes 6b. The electrodes 8a and 8b are made of low-resistance, n-type polysilicon.

The upper electrode 8a is formed to extend along the surface of the interlayer dielectric layer 4, forming a first pad region having a large surface area. Similarly, the upper electrode 8b is formed to extend along the surface of the interlayer dielectric layer 4, forming a second pad region having a large surface area. The first and second pad regions serve as a pair of measuring terminals 22a and 22b of the evaluating semiconductor device 10, respectively.

The four lower electrodes 6a, the common capacitor dielectric 7a, and the common upper electrode 8a constitute the tour first evaluating capacitors 20a. The four lower electrodes 6b, the common capacitor dielectric 7b, and the common upper electrode 6b constitute the second four evaluating capacitors 20b. Here, these capacitors 20a and 20b have equal capacitance values. (Needless to say, these capacitors 20a and 20b may have different capacitance values.)

Figure 4A:
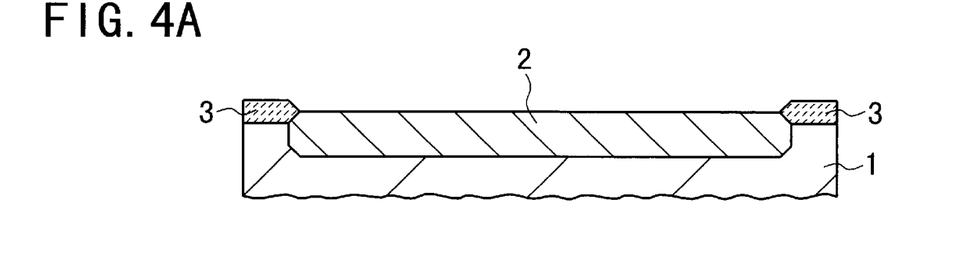
FIGS. 4A to 4C are schematic, partial, cross-sectional views showing the process steps of fabricating the semiconductor device according to the first embodiment of FIGS. 2 and 3, respectively.

The evaluating Semiconductor device 10 according to the first embodiment of FIGS. 2 and 3 is fabricated in the following way. First, as shown in FIG. 4A, the main surface of the p-type single-crystal Si substrate 1 is selectively oxidized to form a silicon dioxide ($SiO_2$) layer serving as the isolation dielectric 3 with a thickness of 500 nm. Then, phosphorus (P) is selectively ion-implanted into the substrate 1 at a specific acceleration energy (e.g., 30 keV) with a specific dose (e.g., $1 \times 10^{15}$ atoms/cm$^2$) by an ion-implantation process, thereby forming the diffusion region 2 in the surface area of the substrate 1. The state at this stage is shown in FIG. 4A.

Next, a BoroPhosphoSilicate Glass (BPSG) layer serving as the interlayer dielectric layer 4 with a thickness of 0.8 μm is deposited on the surface of the substrate 1 by a Chemical vapor Deposition (CVD) process. The contact holes 5 are formed to vertically penetrate the layer 4 to reach the diffusion region 2 by using the lithography and dry etching techniques. For example, each of the holes 5 has a circular plan shape of 0.5 μm. in diameter.

Figure 4B:
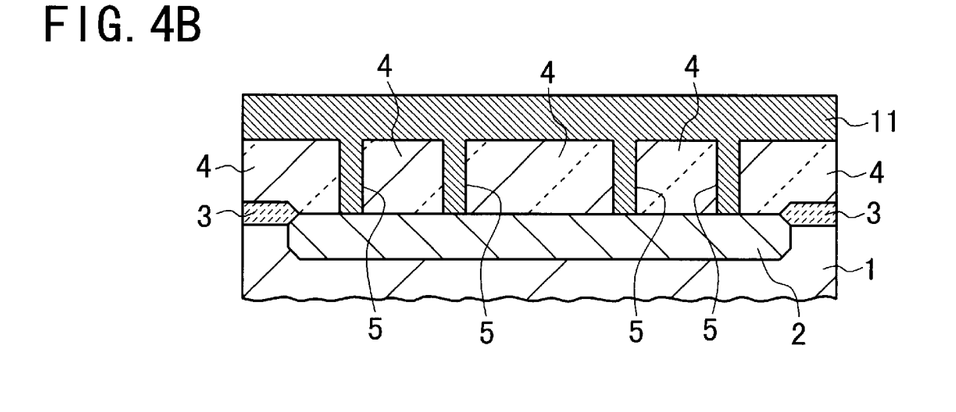

Subsequently, the low-resistance polysilicon layer 11 doped with the n-type impurity is deposited on the interlayer dielectric layer 4 by a CVD process. For example, the layer 11 has a thickness of 400 nm. The contact holes 5 are filled with the n-type polysilicon layer 11. The state at this stage is shown in FIG. 4B.

Figure 4C:
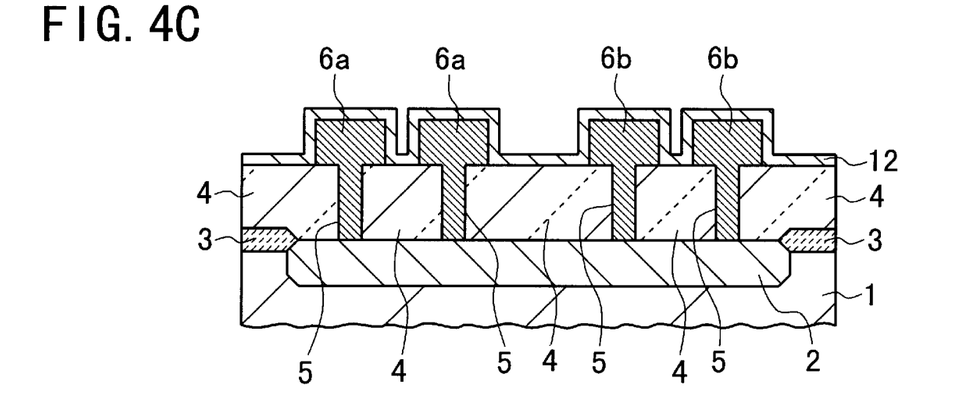

Using the lithography and dry etching techniques, the n-type polysilicon layer 11 is patterned to form the lower electrodes 6a and 6b on the interlayer dielectric layer 4 to be arranged in the layout shown in FIG. 2. The electrodes 6a and 6b are contacted with the diffusion region 2 through the contact holes 5, as shown in FIG. 4C.

A SiN$_x$ layer 12 with a specific thickness (e.g., 10 nm) is deposited on the whole interlayer dielectric layer 4 to cover the lower electrodes 6a and 6b by a CVD process. The state at this stage is shown in FIG. 4C.

On the SiN$_x$ layer 12 thus deposited, an n-type, low-resistance polysilicon layer (not shown) with a specific thickness (e.g., 200 nm) is deposited by a CVD process. Furthermore, using the lithography and dry etching. techniques, the SiN$_x$ layer 12 and the n-type polysilicon layer are simultaneously patterned to form the capacitor dielectrics 7a and 7b from the SiN$_x$ layer 12 and the common upper electrodes 8a and 8b from the n-type polysilicon layer. As a result, the evaluation semiconductor device 10 according to the first embodiment is obtained, as shown in FIGS. 2 and 3.

Next, the principle of the method of evaluating the capacitor characteristic using the semiconductor device 10 according to the first embodiment is explained below.

As seen from the above-described explanation, the lower electrodes 6a are electrically connected to each other by way of the diffusion region 2. Therefore, the four first evaluating capacitors 20a are electrically connected in parallel. Similarly, since the lower electrodes 6b are electrically connected to each other by way of the diffusion region 2, the four second evaluating capacitors 20b are electrically connected in parallel. Moreover, the lower electrodes 6a and 6b are electrically coupled together by way of the diffusion region 2. As a result, the eight evaluation capacitors 20a and 20b on the semiconductor device 10 constitutes the circuit configuration as shown n FIG. 5

Figure 5:
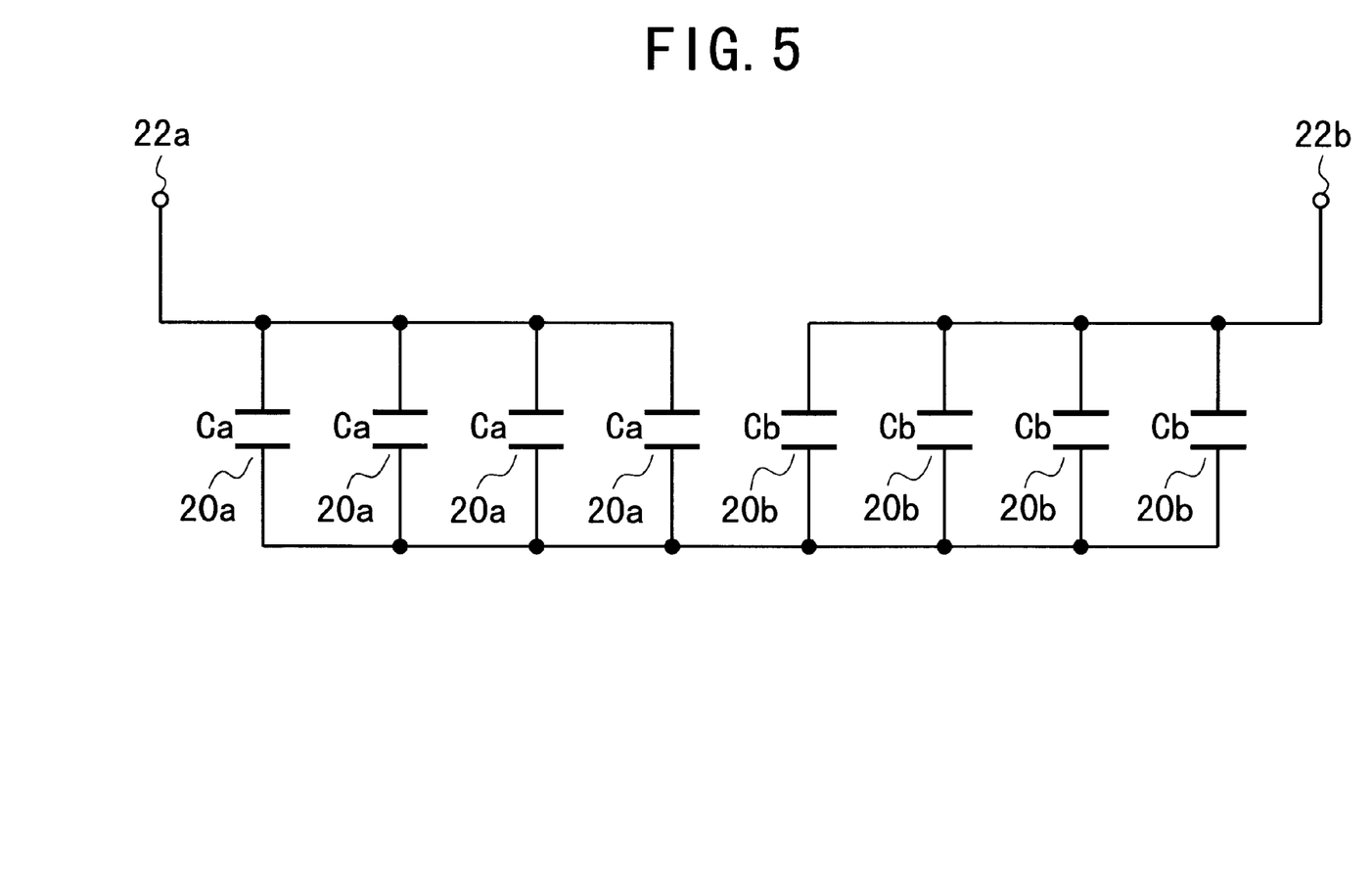
FIG. 5 is a circuit diagram showing the equivalent circuit configuration of the first and second evaluating capacitors of the semiconductor device according to the first embodiment of FIGS. 2 and 3.

As shown in FIG. 5, the four first capacitors 20a have equal capacitances $C_a$ and the four second capacitors 20b have equal capacitances $C_b$, where $C_a = C_b$. One of the electrodes of each capacitor 20a is electrically connected to the measuring terminal 22a. One of the electrodes of each capacitor 20b is electrically connected to the measuring terminal 22b. The other of the electrodes of each capacitor 20a is electrically connected to that of the electrodes of each capacitor 20b.

The circuit in FIG. 5 makes it possible to measure the characteristic of the capacitors 20a or 20b. For example, if the capacitance between the pair of measuring terminals 22a and 22b is defined as $C_m$, the following equation is established.

$$C_M = \frac{4 \cdot C_a \cdot C_b}{C_a + C_b} = 2C_a \text{ or } 2 \cdot C_b$$

Therefore, he capacitance value $C_a$ or $C_b$ of the capacitors 20a or 20b can be given by multiplying the capacitance value $C_M$ with a constant "(½)".

Similarly, the leakage current of the capacitors 20a or 20b can be obtained by multiplying the measured current value with a constant "2".

Next, an evaluation method using the evaluating semiconductor device 10 according to the first embodiment is explained in detail below with reference to FIG. 6, in which the capacitance is measured.

Figure 6:
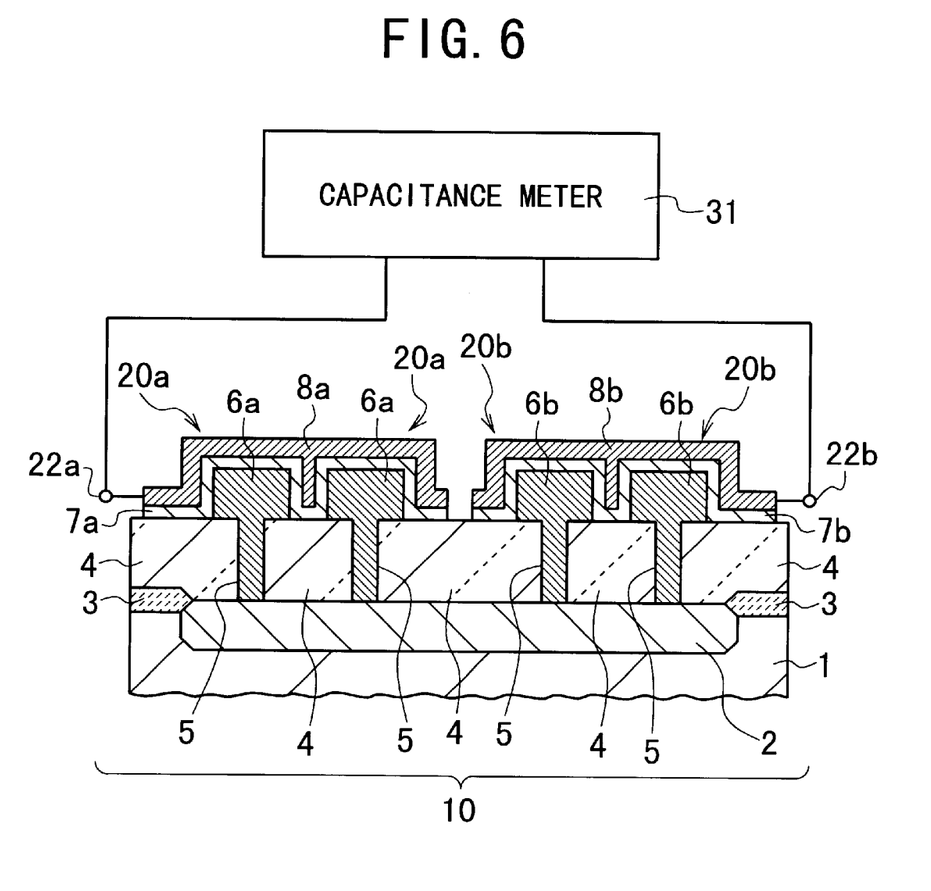
FIG. 6 is a schematic diagram showing an evaluation method of the evaluating capacitors using the semiconductor device according to the first embodiment of FIGS. 2 and 3.

First, a known capacitance meter 31 is electrically connected across the pair of measuring terminals 22a and 22b, as shown in FIG. 6, thereby measuring the capacitance $C_M$ between the terminals 22a and 22b. The electrical connection of the meter 31 to the terminals 22a and 22b is performed by contacting the pair of probes (not shown) of the meter 31 with the first and second pad areas having comparatively wide areas. Thus, this electrical connection can be realized easily, even if no upper wiring line nor electrodes are formed.

The capacitance meter 31 applies a specific voltage across the pair of measuring terminals 22a and 22b and then, it detects an electric current flowing through the terminals 22a and 22b that is generated by the voltage thus applied. The meter 31 calculates automatically the value of the inter-terminal capacitance $C_M$ from the value of the current thus detected.

Next, by multiplying a constant of "(½)" with the value of the capacitance $C_M$ thus obtained, the value of the capacitance $C_a$ of the first capacitors 20a or the capacitance $C_b$ of the second capacitors 20b can be obtained.

The leakage current characteristic of the capacitors 20a or 20b can be easily measured by replacing the capacitance meter 31 with a suitable current meter or ammeter capable of measuring small currents. Similarly, any other characteristic of the capacitors 20a or 20b can be easily measured by replacing the capacitance meter 31 with a suitable measuring apparatus.

With the evaluating semiconductor device 10 and according to the first embodiment of FIGS. 2 and 3 and the evaluation method using the same device 10, the four evaluating capacitors 20a and the four evaluating capacitors 20b are electrically connected in series, where the common upper electrodes 8a and 8b having the wide areas serve as the pair of measuring electrodes 22a and 22b. Therefore, by measuring the characteristic of the capacitors 20a or 20b and by multiplying a suitable constant or constants corresponding to the capacitance values of the capacitors 20a or 20b, the characteristic of the evaluating capacitors 20a or 20b can be obtained easily.

Since the upper electrodes 8a and 8b themselves constitute the pair of measuring electrodes 22a and 22b, no upper wiring lines nor other electrodes are necessary for measuring. Thus, the characteristic of the storage capacitors In the DRAM memory cells can be measured immediately after the completion of their formation processes. This increases the fabrication yield and decreases the fabrication cost of the DRAMs.

Although the evaluating semiconductor device 10 according to the first embodiment of FIGS. 2 and 3 includes the four evaluating capacitors 20a and the four evaluating capacitors 20b, the numbers of the capacitors 20a and 20b are not limited thereto, and they may be set as one, two, or more. In this case, the constant to be multiplied may be suitably set as a specific value according to the numbers of the capacitors 20a and 20b.

The equal capacitance values of the capacitors 20a and 20b are to facilitate the fabrication of the semiconductor device 10. Therefore, the capacitors 20a and 20b may hare different capacitance values, in which the constant to be multiplied is suitably set as a specific value or values according to the capacitance ratio of the capacitors 20a and 20b.

SECOND EMBODIMENT

Figure 7:
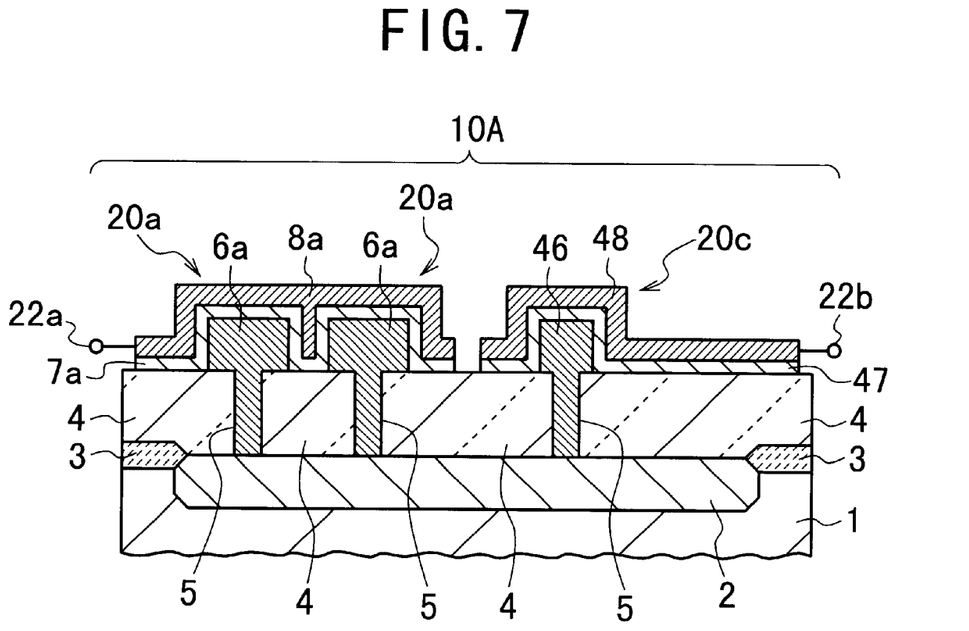
FIG. 7 is a schematic, partial, cross-sectional view showing an evaluating semiconductor device according to a second embodiment of the present invention.

FIG. 7 shows an evaluating semiconductor device 10A according to a second embodiment of the present invention, which has the same configuration as that of the first embodiment except that a second evaluating capacitor 20c is provided instead of the four second evaluating capacitors 20b. Therefore, the explanation about the same configuration is omitted here for the sake of simplification by attaching the same reference symbols as those used in FIGS. 2 and 3 to the same parts or elements in FIG. 7.

As shown in FIG. 7, a lower electrode 46 of the second capacitor 20c is formed on the interlayer dielectric layer 4 to be apart from the four lower electrodes da of the first capacitors 20a. The electrode 46, which has a smaller surface area than that of the electrodes 6a, is contacted with and electrically connected to the underlying diffusion region 2 of the substrate 1 through the corresponding contact hole 5.

A capacitor dielectric 47, which is made of $SiN_x$, is formed on the interlayer dielectric layer 4 to cover the whole lower electrode 46. An upper electrode 48, which is made of low-resistance, n-type polysilicon, is formed on the capacitor dielectric 47 to be entirely overlapped therewith. The upper electrode 48, which has the same pattern as that of the lower electrode 46, is opposite to the lower electrode 46 through the dielectric 47. The electrode 48 constitutes the second pad region having a large area that serves as the measuring terminal 22b.

Since the surface area of the lower electrode 46 is smaller than that of each lower electrode 6a, the capacitance of the second capacitor 20c is smaller than that of each first capacitor 20a. The second capacitor 20c is electrically connected in series to the four, parallel-connected first capacitors 20a by way of the diffusion region 2.

Next, a method of evaluating the capacitor characteristic using the semiconductor device 10A according co the second embodiment is explained below with reference to FIGS. 8A and 8B. Here, the capacitance $C_a$ of the first capacitors 20a is measured.

Figure 8A:
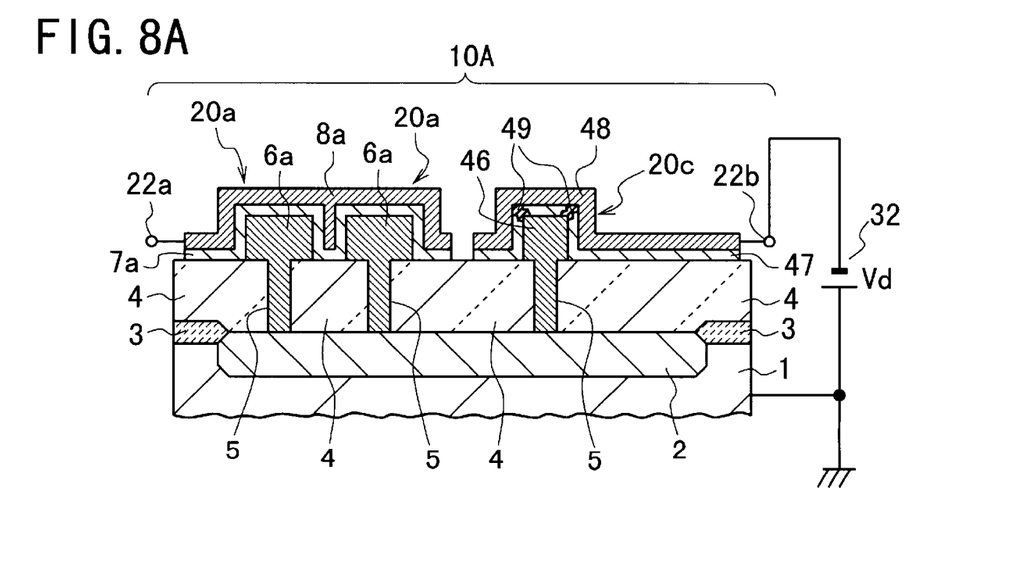
FIGS. 8A and 8B are schematic, partial, cross-sectional views showing an evaluating method of the evaluating capacitors using the semiconductor device according to the second embodiment of FIG. 7, respectively.

First, as shown in FIG. 8A, a dc voltage source 32 for supplying a dc voltage $V_d$ is connected across the substrate 1 and the measuring terminal 22b while the substrate 1 is connected to the ground, thereby applying a dc voltage $(-V_d)$ across the substrate 1 and the upper electrode 48 of the second capacitor 20c. Since the lower electrode 46 of the second capacitor 20c is substantially grounded, the dc voltage $(-V_d)$ is applied across the electrodes 46 and 48.

In other words, by applying the do voltage $(-V_d)$ to the upper electrode 48 through the measuring terminal 22b, a positive voltage is induced in the lower electrode 46. The induced positive voltage $V_d$ in the electrode 46 is applied to the diffusion region 2. As a result, the p-type substrate 1 and the n-type diffusion region 2 are electrically interconnected with each other, resulting in electrical interconnection between the lower electrode 46 and the grounded substrate 1. Thus, the dc voltage $(-V_d)$ is applied across the electrodes 46 and 48.

If the dc voltage $(-V_d)$ is set as a specific value (e.g., −15 V) greater than the dielectric breakdown voltage of the capacitor dielectric 47, electrical insulation of the dielectric 47 is partially broken due to its dielectric breakdown, forming conductive paths 49 between the electrodes 48 and 46. Thus, the electrodes 46 and 48 of the second capacitor 20c are shortcircuited.

Figure 8B:
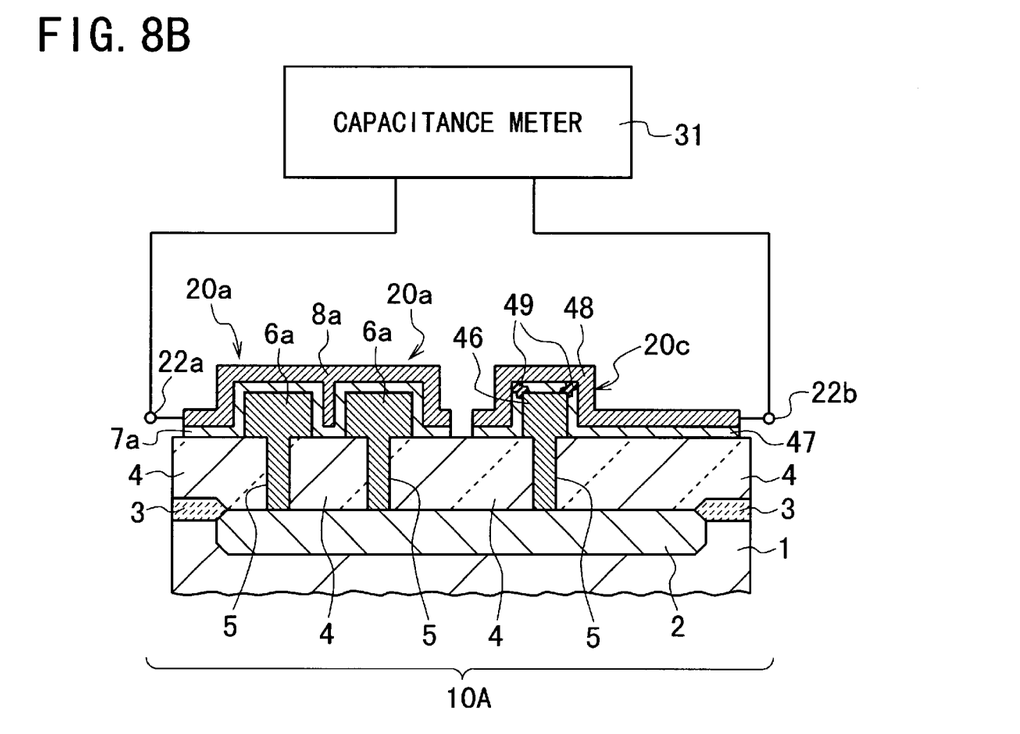

Thereafter, as shown in FIG. 8B, a suitable capacitance meter 31 is electrically connected across the pair of measuring terminals 22a and 22b, thereby measuring the inter-terminal capacitance. $C_M$ between the terminals 22a and 22b. Since the electrical connection of the meter 31 to the terminals 22a and 22b is performed by contacting the pair of probes (not shown) of the mater 31 with the first and second pad areas having comparatively wide areas, this electrical connection can be realized easily.

Since the measurer value or the capacitance $C_M$ is equal to the sum of the four capacitors 20a, i.e., $C_M=4C_a$. Therefore, the capacitance $C_a$ of each evaluating capacitor 20a can be found by multiplying a constant of "(¼)" with the value of the capacitance $C_M$.

Any other characteristic of the capacitors 20a such as the leakage current can be easily measured by replacing the capacitance meter 31 with a suitable measuring apparatus such as a current meter capable of measuring small currents.

The electrical interconnection between the upper and lower electrodes 48 and 46 of the second capacitor 20c can be realized in another way, which is explained below with reference to FIG. 9.

Figure 9:
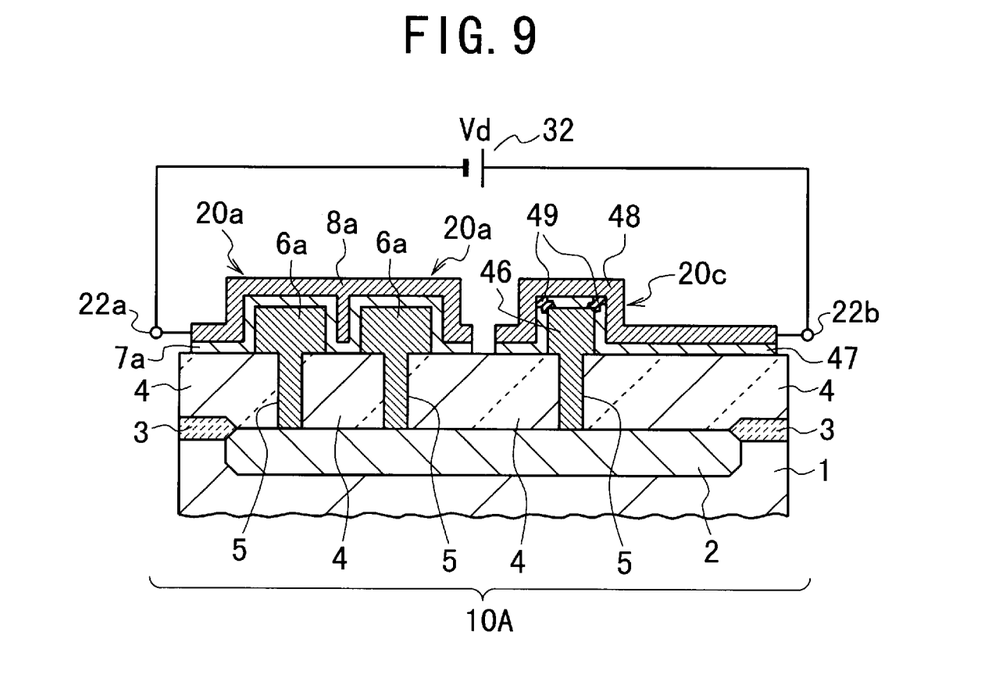
FIG. 9 is a schematic, partial, cross-sectional view showing another evaluating method of the evaluating capacitors using the semiconductor device according to the second embodiment or FIG. 7.

First, as shown in FIG. 9, a dc voltage source 32 for supplying a dc voltage $V_d$ is connected across the pair of measuring terminals 22a and 22b (not across the measuring terminal 22b and the substrate 1). Thus, the dc voltage $V_d$ is applied across the upper electrode 6a of the first capacitors 20a and the upper electrode 48 of the second capacitor 20c.

Since the first and second capacitors 20a and 20c are electrically connected to each other in series, the first capacitors 20a are commonly applied with a divided voltage $V_{d1}$ and the second capacitor 20a is applied with a divided voltage $V_{d2}$, where $V_{d1}+V_{d2}=V_d$. The voltage $V_{d1}$ is inversely proportional to the total capacitance of the first four capacitors 20a and proportional to the electric charges stored in the capacitors 20a. Similarly, the voltage $V_{d2}$ is inversely proportional to the capacitance of the second capacitor 20c and preportional to the electric charge stored in the capacitor 20c. The total electric charge stored in the first four capacitors 20a is equal in amount to that stored in the second capacitor 20c. Since the capacitance of the second capacitor 20c is less than the total capacitance of the first capacitors 20a, the divided voltage $V_{d2}$ applied to the second capacitor 20b is greater than the divided voltage $V_{d1}$ commonly applied to the first capacitors 20a; i.e., $V_{d2}>V_{d1}$.

By setting the divided voltage $V_{d2}$ as a value (e.g., 15 V) greater than the breakdown voltage $V_{bd}$ of the capacitor dielectric 47 of the second capacitor 20c, only the insulation of the dielectric 47 is lost due to its dielectric breakdown to thereby form the conductive paths 49 interconnecting the upper and lower electrodes 48 and 46 with each other. As a result, the second capacitor 20c is short-circuited.

The subsequent measuring steps using the capacitance meter 31 are the same as those explained above with reference to FIG. 8B.

It is preferred that the total capacitance of the first capacitors 20a is ten times as large as that of the second capacitor 20c, or greater. In this case, the divided voltage $V_{d2}$ applied across the electrodes 48 and 46 of the second capacitor 20c is ten times as high as the divided voltage $V_{d1}$ applied commonly across the electrodes 8a and 6a of the first capacitors 20a, or greater. Thus, there is an additional advantage that the dielectric breakdown phenomenon tends to occur more easily in the capacitor dielectric 47 alone.

With the evaluating semiconductor device, 10 according to the second embodiment of FIG. 7, the four first capacitors 20a and the second capacitor 20c are connected in series, where the common upper electrodes 8a and 48 having the wide areas serve as the pair of measuring electrodes 22a and 22b, respectively. Moreover, the upper and lower electrodes 48 and 46 of the second capacitor 20c are electrically interconnected to each other by the application of the external voltage $V_j$ due to dielectric breakdown of the capacitor dielectric 47 of the second capacitor 20c, and then, by measuring the total characteristic of the first capacitors 20a, the characteristic of each capacitor 20a can be obtained.

Also, since no upper wiring lines nor other electrodes are necessary for measuring, the characteristic of the evaluating capacitors 20a (i.e., the storage capacitors in the DRAM memory cells) can be measured immediately after the completion of their formation processes. This results in improvement in both the fabrication yield and the fabrication cost.

Instead of the dc voltage source 32, any ac voltage source or any pulse voltage source may be used as necessary according to the sort of capacitor characteristic

THIRD EMBODIMENT

Figure 10:
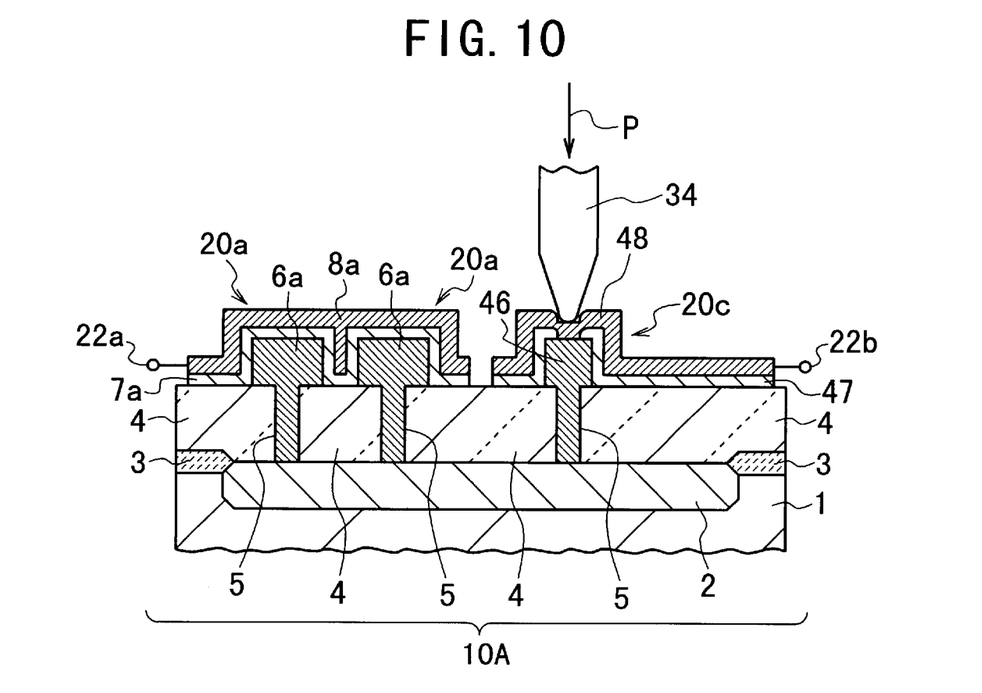
FIG. 10 is a schematic, partial, cross-sectional view showing an evaluating method of the evaluating capacitors according to a third embodiment of the present invention, in which the semiconductor device according to the second embodiment of FIG. 7 is used.

FIG. 10 shows an evaluation method of the capacitor characteristic according to a third embodiment of the present invention, in which the semiconductor device 10A according to the second embodiment o FIG. 7 is used.

First, as shown in FIG. 10, the front end of a probe 34 is attached to the upper electrode 48 of the second capacitor 20c and then, an external pressure P is vertically applied to the electrode 48 along the arrow shown in FIG. 10. Since both the upper electrode 48 made of polysilicon and the capacitor dielectric 47 made of $SiN_x$ are formed thin, they tend to be deformed by the applied pressure P. Also, the dielectric 47 is lower in toughness than the electrode 48. Accordingly, if the pressure P is higher than a specific threshold strength of the dielectric 47, the dielectric 47 is broken by the pressure P so that the upper electrode 48 is contacted with the top of the lower electrode 46 at the broken point of the dielectric 47, resulting in electrical interconnection of the upper and lower electrodes 48 and 46.

The subsequent measuring steps using the capacitance meter 31 are the same as those explained above with reference to FIG. 8B. Specifically, as shown in FIG. 8B, a suitable capacitance meter 31 is electrically connected across the pair of measuring terminals 22a and 22b, thereby measuring the inter-terminal capacitance $C_M$ between the terminals 22a and 22b. Since the measured value of the capacitance $C_M$ is equal to the sum of the four capacitors 20a, i.e., $C_M=4C_a$. Therefore, the capacitance $C_B$ of each evaluating capacitor 20a can be found by multiplying a constant of "(¼)" with the value of the capacitance $C_M$.

Any other characteristic of the capacitors 20a such as the leakage current can be easily measured by replacing the capacitance meter 31 with a suitable measuring apparatus such as a current meter capable of measuring small currents.

With the evaluation method according to the third embodiment of FIG. 10, it is needless to say that the same advantages as those in the second embodiment can be obtained.

FOURTH EMBODIMENT

Figure 11A:
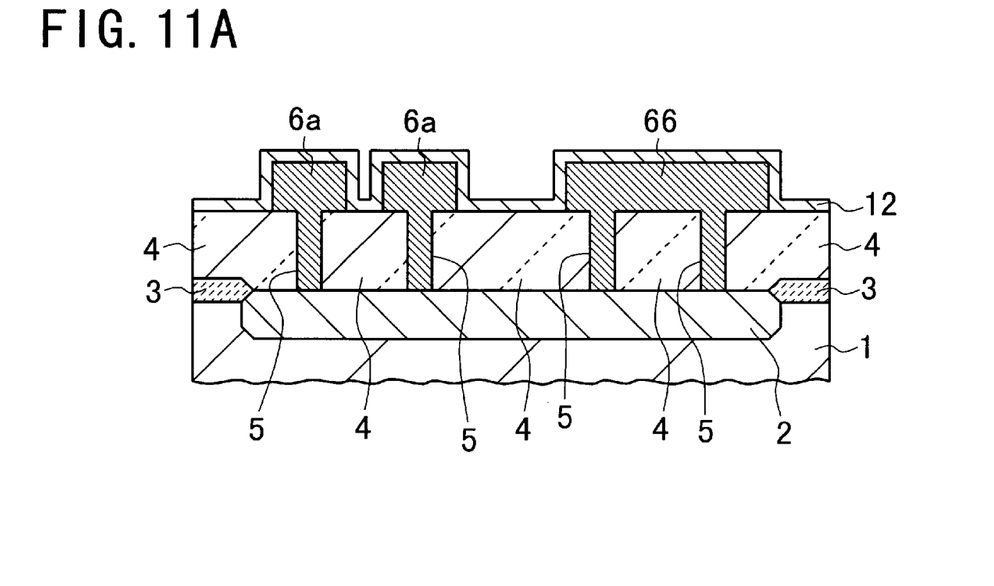
FIGS. 11A and 11B are schematic, partial, cross-sectional views showing the process steps of fabricating an evaluating semiconductor device according to a fourth embodiment of the present invention, respectively.
Figure 11B:
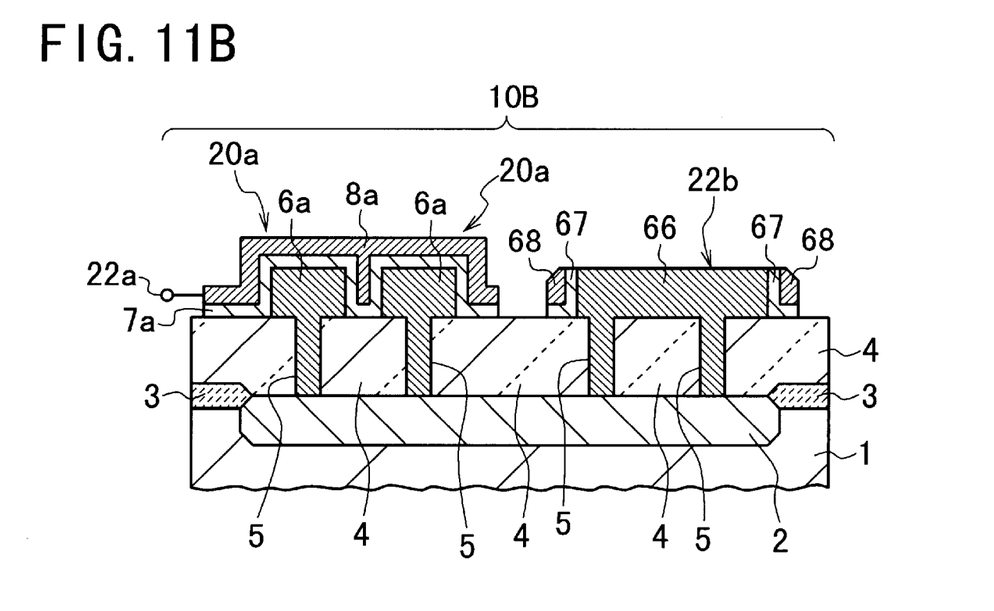

FIG. 11B shows an evaluating semiconductor device 10B for the capacitor characteristic according to a fourth embodiment of the present invention, which has the same configuration as the device 10 according to the first embodiment except that only the first four capacitors 20c are provided on the substrate 1 (i.e., no second capacitor is provided). Therefore, the explanation about the same configuration is omitted here for the sake of simplification by attaching the same reference symbols as those used in FIGS. 2 and 3 to the same parts or elements in FIG. 11B.

As shown in FIG. 11B, instead of the second capacitor 20b, an electrode 66 is formed on the interlayer dielectric layer 4 to be contacted with and electrically connected to the underlying diffusion region 2 of the substrate 1 through the contact holes 5. The electrode 66 serves as the measuring electrode 22b.

The semiconductor device 10B is fabricated in the following way.

First, as shown in FIG. 11A, the surface of the p-type single-crystal Si substrate 1 is selectively oxidized to form a $SiO_2$ layer serving as the isolation dielectric 3 with a thickness of 500 nm. Then, phosphorus (P) is selectively ion-implanted into the substrate 1 at a specific acceleration energy (e.g., 30 keV) with a specific dose (e.g., $1\times10^{15}$ atoms/cm$^2$) by an ion-implantation process, thereby forming the diffusion region 2 in the surface area of the substrate 1.

Next, a BPSG layer serving as the interlayer dielectric layer 4 with a thickness of 0.8 $\mu$m is deposited on the surface of the substrate 1 by a CVD process. The contact holes 5 are formed to vertically penetrate the layer 4 to reach the diffusion region 2 by using the lithography and dry etching techniques. For example, each of the holes 5 has a circular plan shape of 0.5 $\mu$m in diameter.

Subsequently, the n-type polysilicon layer (not shown) is deposited on the interlayer dielectric layer 4 by a CVD process. For example, this layer has a thickness of 400 nm. The contact holes 5 are filled with the n-type polysilicon layer.

Using the lithography and dry etching techniques, the n-type polysilicon layer thus deposited is patterned to form the lower electrodes 6a and the electrode 66. These electrodes 6a and 66 are contacted with the diffusion region 2 through the contact holes 5, as shown in FIG. 11A. The electrode 66, which is apart from the electrodes 6a, is larger in plan shape than each electrode 6a. The electrode 66 may have an approximately the same size as that of the pad region.

A $SiN_x$ layer 12 with a specific thickness (e.g., 10 nm) is deposited on the interlayer dielectric layer 4 to cover the lower electrodes 6a and the electrode 66 by a CVD process. The state at this stage is shown in FIG. 11A.

On the $SiN_x$ layer 12, an n-type polysilicon layer (not shown) with a specific thickness (e.g., 200 nm) is deposited by a CVD process. Furthermore, using the lithography and dry etching techniques, the $SiN_x$ layer 12 and the n-type polysilicon layer are simultaneously patterned to form the common capacitor dielectric 7a and the common upper electrode 8a for the first capacitors 20a. At this time, the parts of the $SiN_x$ layer 12 and the polysilicon layer located on the electrode 66 are removed by overetching to thereby expose the top face of the electrode 66, resulting in a $SiN_x$ layer 67 covering the side faces of the electrode 66 and a polysilicon layer 68 located on the layer 67. Thus, the evaluation semiconductor device 10B according to the fourth embodiment is fabricated, as shown in FIG. 11B.

In the semiconductor device 10B, the common upper electrode 8a is formed to extend along the interlayer dielectric layer 4, thereby forming the first pad region electrically connected to the measuring terminal 22a. The electrode 66 serves as the measuring terminal 22b and the second pad region. Therefore, the characteristic of the four evaluating capacitors 20a can be measured by using the measuring terminals 22a and 22b in the similar way to that shown in the second embodiment.

Although the whole top face of the electrode 66 is exposes in the fourth embodiment of FIG. 11B, the dielectric 12 may be partially or entirely left on the top of the electrode 66, the reason of which is as follows.

If the dielectric 12 is partially left on the top of the electrode 66, the end of the probe of a measuring apparatus can be attached onto the electrode 66 through the opening of the dielectric 12. Even if the dielectric 12 is entirely left on the top of the electrode 66, by pressing the end of the probe of a measuring apparatus onto the dielectric 12 toward the electrode 66 with a specific pressure, the dielectric 12 tends to be easily broken to result in electrical interconnection between the attached probe and electrode 66.

With the semiconductor device 103 and the evaluation method according to the fourth embodiment of FIG. 11B, the same advantages as those in the second embodiment can be obtained.

VARIATIONS

In the above-described first to fourth embodiments, the lower electrodes 6a of the first evaluating capacitors 20a and the lower electrodes 6b of the second evaluating capacitors 20b are electrically connected to each other through the n-type diffusion region 2. However, their electrical connection maybe realized through any interconnection line such as any conductive region or layer, such as an impurity-doped polysilicon layer, a metal film, and so on. The interconnection line needs nor located on or in the substrate 1, and it may be located above the substrate 1, or in a wiring layer.

The electrical interconnection of the electrodes 6a, 6b, 46, and 66 with the diffusion region 2 is realized by the contact holes 5. However, it may be realized by any other structure.

As the material for the electrodes 6a, 6b, 46, and 66, n-type polysilicon is used in the above first to fourth embodiments. However, it is needless to say that any other conductive material may be used for this purpose.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device for characteristic evaluation, comprising:

(a) a semiconductor substrate;

(b) an interlayer dielectric layer formed on or over said substrate;

(c) a first electrode formed on said interlayer dielectric layer;

(d) a second electrode formed on said interlayer dielectric layer to be apart from said first electrode;
said second electrode being electrically connected to said first electrode through an interconnection line;

(e) a first capacitor dielectric formed to cover said first electrode;
said first capacitor dielectric being contacted with said first electrode;

(f) a second capacitor dielectric formed to cover said second electrode;
said second capacitor dielectric being contacted with said second electrode;

(g) a third electrode formed on said first capacitor dielectric to be opposite to said first electrode through said first capacitor dielectric;

(h) a fourth electrode formed on said second capacitor dielectric to be apart from said third electrode;
said fourth electrode being be opposite to said second electrode through said second capacitor dielectric;

(i) said first and third electrodes and said first capacitor dielectric constitute a first evaluating capacitor and said second and fourth electrodes and said second capacitor dielectric constitute a second evaluating capacitor; and (j) said third and fourth electrodes constitute a pair of measuring terminals.

2. The device according to claim 1, wherein said first and second capacitors are equal in capacitance.

3. The device according to claim 1, said capacitor dielectric has a dielectric breakdown voltage;

and wherein when an external voltage greater than said dielectric breakdown voltage is applied across said second and fourth electrodes, said second and fourth electrodes are electrically connected to each other due to dielectric breakdown of said second capacitor dielectric.

4. The device according to claim 3, wherein said first capacitor is greater in capacitance than said second capacitor.

5. The device according to claim 4, wherein said first capacitor has a capacitance ten times as large as that of said second capacitor, or greater.

6. The device according to claim 1, said capacitor dielectric has a dielectric breakdown voltage;

and wherein when an external voltage greater than said dielectric breakdown voltage is applied across said fourth electrode and said substrate, said fourth electrode is electrically connected to said substrate due to dielectric breakdown of said second capacitor dielectric.

7. The device according to claim 6, wherein said first capacitor is greater in capacitance than said second capacitor.

8. The device according to claim 7, wherein said first capacitor has a capacitance ten times as large as that of said second capacitor, or greater.

9. The device according to claim 1, said second capacitor dielectric has a mechanical breakdown strength;

and wherein when an external pressure greater than said mechanical breakdown strength is applied to said fourth electrode, said fourth electrode is deformed, thereby electrically connecting said fourth electrode to said second electrode.

10. A semiconductor device for characteristic evaluation, comprising:

(a) a semiconductor substrate;

(b) an interlayer dielectric layer formed on or over said substrate;

(c) a first electrode formed on said interlayer dielectric layer;

(d) a second electrode formed on said interlayer dielectric layer to be apart from said first electrode;
said second electrode being electrically connected to said first electrode through an interconnection line;

(e) a capacitor dielectric formed to cover said first electrode;
said capacitor dielectric being contacted with said first electrode;

(f) a third electrode formed on said capacitor dielectric to be opposite to said first electrode through said capacitor dielectric;

(g) said first and third electrodes and said capacitor dielectric constitute an evaluating capacitor; and (h) said second and third electrodes constitute a pair of measuring terminals.

11. A method of evaluating the capacitor characteristic, comprising the steps of:
   (a) preparing the semiconductor device as claimed in claim 1;
   (b) electrically connecting a measuring apparatus across said pair of measuring terminals to generate a measurement result; and
   (c) multiplying a specific constant with said measurement result, thereby finding a characteristic of said first or second capacitor.

12. The method according to claim 11, wherein said first and second capacitors are equal in capacitance.

13. A method of evaluating the capacitor characteristic, comprising the steps of:
   (a) preparing a semiconductor device as claimed in claim 1;
   (b) applying an external voltage across said fourth electrode and said substrate, thereby electrically interconnecting said fourth electrode with said second electrode due to dielectric breakdown of said second capacitor dielectric; and
   (c) electrically connecting a measuring apparatus across said pair of measuring terminals to generate a measurement result, thereby finding a characteristic of said first evaluating capacitor from said measurement result.

14. A method of evaluating the capacitor characteristic, comprising the steps of:
   (a) preparing a semiconductor device as claimed in claim 1;
   (b) applying an external voltage across said pair of measuring terminals, thereby electrically interconnecting said fourth electrode with said second electrode due to dielectric breakdown of said second capacitor dielectric; and
   (c) electrically connecting a measuring apparatus across said pair of measuring terminals to generate a measurement result, thereby finding a characteristic of said first evaluating capacitor from said measurement result.

15. The method according to claim 14, wherein said first capacitor is greater in capacitance than said second capacitor.

16. The method according to claim 15, wherein said first capacitor has a capacitance ten times as large as that of said second capacitor, or greater.

17. A method of evaluating the capacitor characteristic, comprising the steps of:
   (a) preparing a semiconductor device as claimed in claim 1;
   (b) applying an external pressure to said fourth electrode, thereby electrically interconnecting said fourth electrode with said second electrode due to deformation of said fourth electrode and mechanical breakdown of said second capacitor dielectric; and
   (c) electrically connecting a measuring apparatus across said pair of measuring terminals to generate a measurement result, thereby finding a characteristic of said first evaluating capacitor from said measurement result.

* * * * *